US012769378B2

(12) United States Patent
Qu et al.

(10) Patent No.: US 12,769,378 B2
(45) Date of Patent: Oct. 20, 2026

(54) LIQUID COOLING DEVICE, AND APPARATUS

(71) Applicant: EVEX TECHNOLOGY CO., LTD., Guangdong (CN)

(72) Inventors: Zhongjiang Qu, Shanghai (CN); Guangliang Guo, Shanghai (CN); Dongrui Xue, Shanghai (CN)

(73) Assignee: EVEX TECHNOLOGY CO., LTD., Guangdong (CN)

( * ) Notice: Subject to any disclaimer, the term of this patent is extended or adjusted under 35 U.S.C. 154(b) by 466 days.

(21) Appl. No.: 18/276,514

(22) PCT Filed: Oct. 21, 2021

(86) PCT No.: PCT/CN2021/125393
§ 371 (c)(1),
(2) Date: Aug. 9, 2023

(87) PCT Pub. No.: WO2022/170785
PCT Pub. Date: Aug. 18, 2022

(65) Prior Publication Data

US 2024/0310886 A1 Sep. 19, 2024

(30) Foreign Application Priority Data

Feb. 9, 2021 (CN) ........................ 202110181444.X

(51) Int. Cl.
*G06F 1/20* (2006.01)
*H05K 7/20* (2006.01)

(52) U.S. Cl.
CPC .............. *G06F 1/206* (2013.01); *G06F 1/203* (2013.01); *H05K 7/20272* (2013.01); *H05K 7/20772* (2013.01); *G06F 2200/201* (2013.01)

(58) Field of Classification Search
CPC .............. F28D 1/03; F28D 2021/0029; H05K 7/20272; H05K 7/20327; H05K 7/20772;
(Continued)

(56) References Cited

U.S. PATENT DOCUMENTS 4,870,477 A * 9/1989 Nakanishi ............. H01L 23/433 257/E23.091
5,023,695 A * 6/1991 Umezawa ........... H10W 40/475 257/714
(Continued)

FOREIGN PATENT DOCUMENTS

CN 102317027 A 1/2012
CN 111595536 A 8/2020
(Continued)

OTHER PUBLICATIONS

Office action issued on Nov. 5, 2024 from Japan Intellectual Property Office in a counterpart Japanese Patent Application No. 2023-548279 (all the cited references are listed in this IDS.) (English translation is also submitted herewith.).
(Continued)

*Primary Examiner* — Eric S Ruppert
*Assistant Examiner* — Hans R Weiland
(74) *Attorney, Agent, or Firm* — The PL Law Group, PLLC

(57) ABSTRACT

A liquid cooling device includes a cooling base plate, a first sealing cover plate and a first sealing tube, wherein the first sealing cover plate and the cooling base plate form a first sealing cavity; and the first sealing tube and the first sealing cavity form a liquid cooling channel used for conveying a liquid cooling medium; a second sealing cover plate is fixed on the cooling base plate, and a second sealing tube is fixed on the second sealing cover plate, the second sealing cover plate and the second sealing tube form a second sealing
(Continued)

cavity. The liquid cooling device has an excellent sealing performance, and a reliability problem caused by water leakage of the first sealing cavity is eliminated, thus improving the safety of the liquid cooling device.

16 Claims, 8 Drawing Sheets

(58) Field of Classification Search
CPC . G06F 1/20; G06F 1/203; G06F 1/206; G06F 2200/201
See application file for complete search history.

(56) References Cited

U.S. PATENT DOCUMENTS

| | | | | |
|---|---|---|---|---|
| 5,086,829 | A * | 2/1992 | Asakawa | H05K 7/20281 361/699 |
| 5,537,291 | A * | 7/1996 | Onodera | H01L 23/473 257/E23.098 |
| 6,778,393 | B2 * | 8/2004 | Messina | H10W 40/774 361/689 |
| 2001/0014029 | A1 * | 8/2001 | Suzuki | H05K 7/20927 363/141 |
| 2007/0051166 | A1 * | 3/2007 | Baker | G01M 3/188 73/40.5 R |
| 2011/0313576 | A1 * | 12/2011 | Nicewonger | H05K 7/20781 361/701 |
| 2013/0277008 | A1 | 10/2013 | Ishikura et al. | |
| 2019/0368832 | A1 * | 12/2019 | Huang | G06F 1/20 |
| 2020/0025641 | A1 * | 1/2020 | Long | H05K 7/20254 |
| 2020/0340767 | A1 * | 10/2020 | Holden | H05K 7/20254 |
| 2021/0088404 | A1 * | 3/2021 | Li | G06F 11/1441 |
| 2021/0385970 | A1 * | 12/2021 | Su | G01M 3/3263 |
| 2022/0196507 | A1 * | 6/2022 | Subrahmanyam | H05K 7/2079 |

FOREIGN PATENT DOCUMENTS

| | | | | |
|---|---|---|---|---|
| CN | 112860042 | A | 5/2021 | |
| EP | 1 571 534 | A2 | 9/2005 | |
| JP | 2010-194545 | A | 9/2010 | |
| JP | 2011-075088 | A | 4/2011 | |
| JP | 3168106 | U | 6/2011 | |
| JP | 2011198781 | A * | 10/2011 | H01L 24/33 |
| JP | 2012-004405 | A | 1/2012 | |
| JP | 2013-222914 | A | 10/2013 | |
| JP | 2014216446 | A * | 11/2014 | H01L 25/04 |
| JP | 2014239177 | A * | 12/2014 | |

OTHER PUBLICATIONS

International Search Report for PCT/CN2021/125393 mailed on Jan. 13, 2022.

* cited by examiner

LIQUID COOLING DEVICE, AND APPARATUS

CROSS-REFERENCE TO RELATED APPLICATION AND CLAIM OF PRIORITY

This application claims benefit under 35 U.S.C. 119, 120, 121, or 365(c), and is a National Stage entry from International Application No. PCT/CN2021/125393, filed Oct. 21, 2021, which claims priority to the benefit of Chinese patent application No. 202110181444.X filed in the China Intellectual Property Office on Feb. 9, 2021, the entire contents of which are incorporated herein by reference.

BACKGROUND

1. Technical Field

The present application relates to the technical field of heat dissipation for electronic devices, and more particularly to a liquid cooling device and apparatus.

2. Background Art

Currently, with the rapid development of electronic products, the power consumption of electronic devices is getting higher and higher. Due to the continuous increase in the power consumption of their single-chip, the current air cooling technology has reached the limit of heat dissipation. Therefore, it is necessary to develop a new generation of liquid cooling technology to solve the heat dissipation problem of high-power chips. For example, the CPU, a core component in electronic devices, is mainly responsible for the operation and calculation of the electronic device. It has a heavy workload and easily generates a large amount of heat, which can slow down the operation speed of the electronic device, and in serious cases, it can even burn the CPU. Therefore, it is necessary to use a heat sink to cool and dissipate the heat of the CPU in the electronic device. Most of the CPU heat sinks on the market are air-cooled. As the power consumption of the CPU continues to increase, the current air cooling technology can hardly solve the CPU's heat dissipation problem. Further development of liquid cooling technology, such as cold plate liquid cooling technology, is needed to cope with the heat dissipation of high-power CPUs.

However, if the sealing of the water tube joint of the water-cooled CPU cold plate is not good enough, the coolant can easily leak at the joint, and the welds or seams of the CPU cold plate itself also have the risk of liquid leakage. Once the coolant leaks, it will destructively damage the electronic device, greatly increase the economic loss of the user, and is not conducive to mass promotion and use. Therefore, it is necessary to provide a new liquid cooling device to solve the above problems.

SUMMARY

The purpose of the embodiments of the present application is to provide a liquid cooling device and apparatus that has superior sealing performance, eliminates the reliability problems caused by leakage of the first sealing cavity, and thus improves the safety of the liquid cooling device.

The embodiments of the present application provide a liquid cooling device that includes: a first sealing body, which includes a cooling base plate, a first sealing cover plate, and a first sealing tube; the cooling base plate is used to contact a device to be cooled, to cool the device to be cooled; the first sealing cover plate is fixed on the cooling base plate, and together with the cooling base plate forms a first sealing cavity; the first sealing tube is fixed on the first sealing cover plate, and is in communication with the first sealing cavity, the first sealing tube and the first sealing cavity together form a liquid cooling channel used for conveying a liquid cooling medium; A second sealing body, which includes a second sealing cover plate with a receiving space and a second sealing tube, the second sealing cover plate is fixed on the cooling base plate, and covers the first sealing cover plate; the second sealing tube is fixed on the second sealing cover plate, the second sealing cover plate and the second sealing tube together form a second sealing cavity, and the liquid cooling channel is located in the second sealing cavity.

The embodiments of the present application also provide an apparatus, including an electronic device, and the above-mentioned liquid cooling device. The liquid cooling device is used to contact the device to be cooled, to cool the device to be cooled.

Compared with the related technology, this application embodiment, by setting up the first sealing body, achieves cooling of the device to be cooled and itself; by setting up the second sealing body, since the second sealing cover and the second sealing tube together form the second sealing cavity, even if some liquid cooling medium leaks from the first sealing body, the liquid cooling medium will not come into contact with the device to be cooled or other electronic devices, but will be contained in the second sealing cavity, avoiding damage to the device to be cooled or other electronic devices due to contact with the liquid cooling medium, improving the safety of the liquid cooling device. In addition, the second sealing cover plate covers the first sealing cover plate, and the liquid cooling channel is located in the second sealing cavity. That is to say, no matter where the liquid leaks from the first sealing body, it can ensure that the leaked liquid is contained in the second sealing cavity, which makes the liquid cooling device have superior sealing performance, and further improves the safety of the liquid cooling device. By setting this structure, the contact area between the second sealing cover plate and the cooling base plate can be increased, thereby enabling the second sealing cover plate to be stably fixed on the cooling base plate.

Further, the second sealing cover plate includes: a upper plate located on the side of the first sealing cover plate away from the cooling base plate, a side plate that together with the upper plate forms the receiving space, a contact plate that extends from the edge of the side plate away from the upper plate in the direction away from the first sealing cover plate; The liquid cooling device further includes an adhesive part, the contact plate is fixedly connected to the cooling base plate via the adhesive part.

Further, the contact plate has a first screw hole, the cooling base plate has a second screw hole, the first screw hole is directly opposite the second screw hole; The liquid cooling device further includes a screw, the screw is fixed in the first screw hole and the second screw hole. With this structural arrangement, the fixation between the second sealing cover plate and the cooling base plate can be strengthened, thereby further enhancing the stability of the liquid cooling device.

Further, the liquid cooling device further includes a liquid leakage sensor, the liquid leakage sensor is set in the second sealing cavity and is located outside the liquid cooling channel, the liquid leakage sensor is used to send an alarm message when it senses the presence of liquid in the second sealing cavity. By this means, alarm information can be promptly issued when leakage occurs in the first sealing body, thereby further improving the safety and reliability of the liquid cooling device.

Further, that the second sealing tube has an aperture, the liquid leakage sensor extends partially out of the second sealing cavity through the aperture to connect with an external circuit board; The liquid cooling device further includes a sealing part, the sealing part is used to seal the aperture. By setting the sealing part to seal the aperture, that is, the seam between the liquid leakage sensor and the aperture is sealed, the leaked liquid will not flow out from the seam, thereby further improving the safety of the liquid cooling device.

Further, the second sealing tube is in communication with the receiving space and has an aperture in communication with the outside, the liquid in the second sealing cavity is discharged to the outside through the aperture. With this structural arrangement, the second sealing tube can serve as a drainage tube to discharge the liquid inside the second sealing cavity, thus enhancing the practicality of the liquid cooling device.

Further, the second sealing tube is a first soft tube, the first soft tube and the second sealing cover plate are reinforced by a first predetermined manner, the first predetermined manner includes welding fixation and/or sealing part fixation. With this structural arrangement, the connection between the second sealing cover plate and the second sealing tube can be secured more stably.

Further, the second sealing tube is a hard tube, the hard tube and the second sealing cover plate are reinforced by a second predetermined manner, the second predetermined manner includes one or more from welding fixation, sealing part fixation, screw fixation, or rivet fixation.

Further, that the first sealing tube includes a joint and a second soft tube, one end of the joint is fixed on the first sealing cover plate, the other end of the joint has a limiting part, the second soft tube is fixedly connected to the joint via the limiting part; wherein, the limiting part is a hollow conical protrusion extending from the end of the joint away from the first sealing cover plate, in the direction away from the first sealing cover plate; the size of the hollow conical protrusion near the first sealing cover plate is greater than the size of the hollow conical protrusion far from the first sealing cover plate. With this structural arrangement, the soft tube and the joint are more firmly combined, preventing the tube from falling off, and enhancing the reliability of the liquid cooling device.

DETAILED DESCRIPTION OF THE EMBODIMENTS

A cold plate type liquid cooling device includes a cold plate and a tube line, which are assembled together by welding (hard tube) or crimping (soft tube). The interior of the cold plate contains a liquid (generally pure water). At present, there are mainly two design schemes for the server liquid cooling cold plate, but both of them can hardly effectively prevent liquid leakage, and therefore it is difficult to ensure that the electronic devices will not be damaged.

Figure 1:
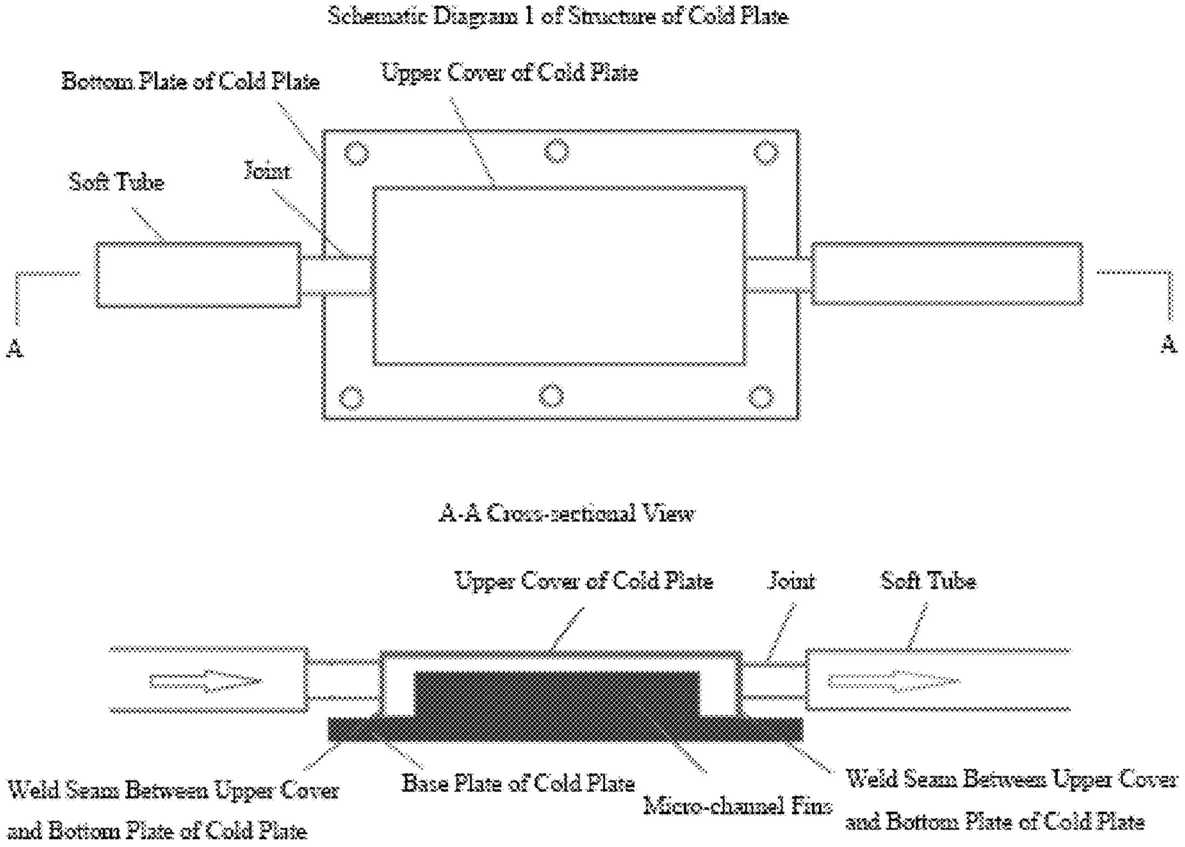
Prior Art FIG. 1
FIG. 1 is a schematic diagram of the structure of a liquid-cooled cold plate in the prior art.

Analyzing the first design scheme of the server liquid cooling cold plate: As shown in FIG. 1, the bottom plate of the cold plate is welded with the upper cover of the cold plate, the joint is welded with the upper cover of the cold plate, and the soft tube is sleeved on the joint. It is not difficult to find that in the above solution, there is a risk of liquid leakage at the weld seam between the bottom plate of the cold plate and the upper cover of the cold plate, the weld seam between the joint and the upper cover of the cold plate, and the connection between the soft tube and the joint. When the liquid leaks, the liquid will directly flow to the electronic devices inside the chassis, causing damage to the electronic devices.

Figure 2:
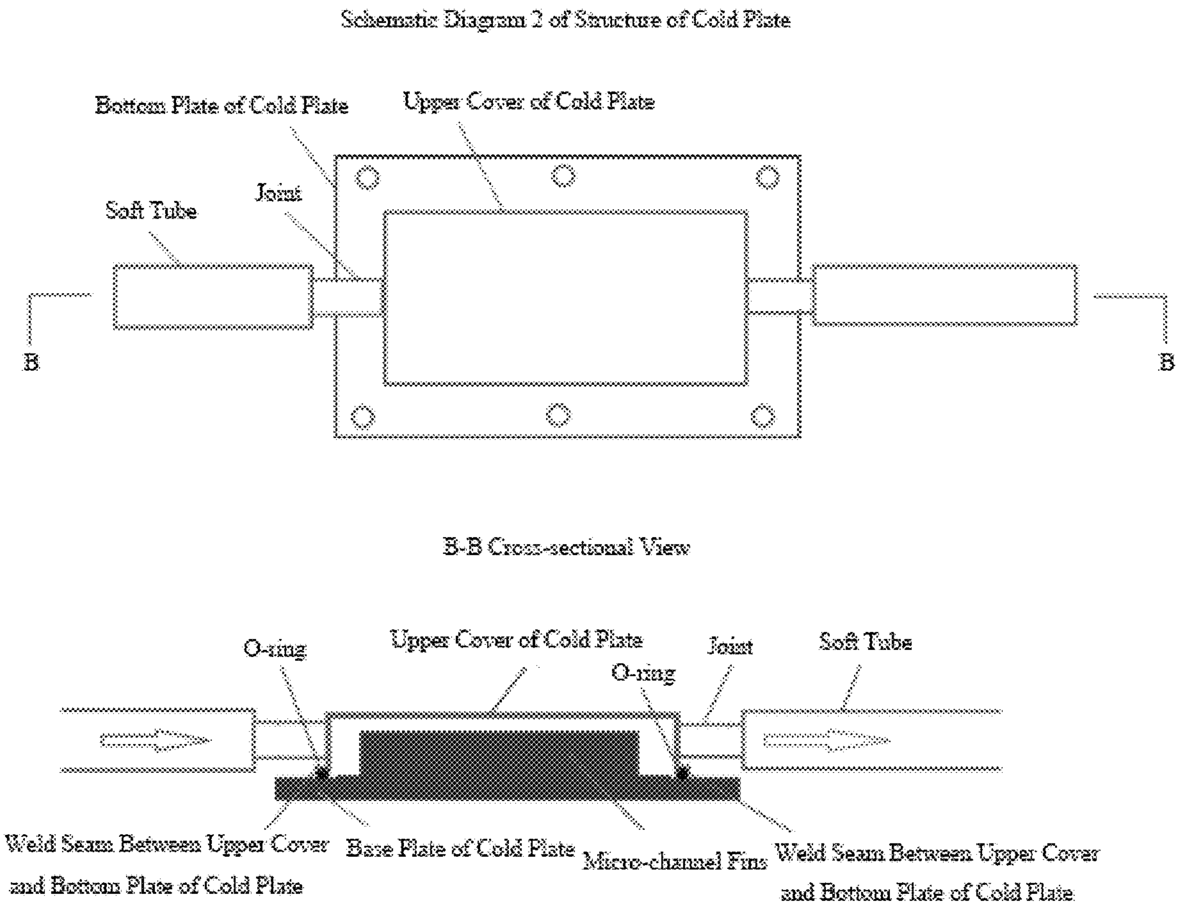
Prior Art FIG. 2
FIG. 2 is another schematic diagram of the structure of a liquid-cooled cold plate in the prior art.

Analyzing the second design scheme of the server liquid cooling cold plate: As shown in FIG. 2, the bottom plate of the cold plate and the upper cover of the cold plate are sealed with an O-ring, the joint is welded with the upper cover of the cold plate, and the soft tube is sleeved on the joint. In the above scheme, there is a risk of liquid leakage at the seam between the bottom plate of the cold plate and the upper cover of the cold plate, the weld seam between the joint and the upper cover of the cold plate, and the connection between the soft tube and the joint. When the liquid leaks, the liquid will directly flow to the electronic devices inside the chassis, causing damage to the electronic devices.

As can be seen from the above analysis, the reasons for the damage to the electronic devices include: the liquid in the liquid cooling device will directly flow to the electronic devices after leakage; there are multiple places in the liquid cooling device that are at risk of leakage.

To this end, the embodiments of the present application provide a liquid cooling device, by setting a second sealing body, even if there is partial liquid coolant leaking from the first sealing body, the liquid coolant will not come into contact with the device to be cooled or other electronic devices, but will be contained in the second sealing cavity; in addition, the second sealing cover houses the first sealing cover, and the liquid cooling channel is located inside the second sealing cavity, no matter where the first sealing body leaks, it can ensure that the leaked liquid is contained in the second sealing cavity, thereby giving the liquid cooling device superior sealing performance, and further improving the safety of the liquid cooling device.

For the purpose, technical solution, and advantages of the embodiments of the present application to be clearer, the following provides a detailed explanation of the various embodiments of the present application in conjunction with the accompanying drawings. However, it can be understood by the ordinary skilled person in the art that many technical details are presented in the embodiments of the present application to help the reader better understand this application. Nevertheless, even without these technical details and various changes and modifications based on the following embodiments, the technical solutions sought to be protected by this application can still be achieved.

Figure 3:
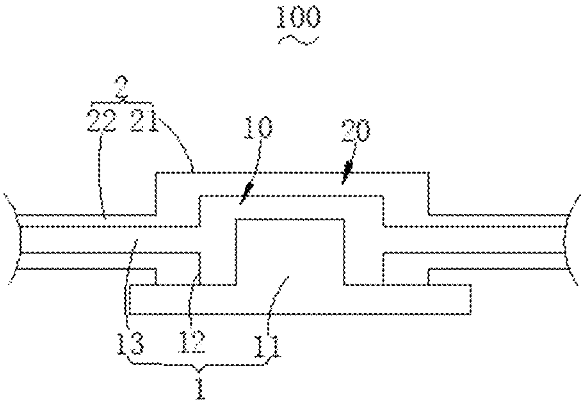
FIG. 3 is a schematic diagram of the structure of a liquid cooling device according to a first embodiment of the present application.

The first embodiment of the present application involves a liquid cooling device, the specific structure of which is shown in FIG. 3 and includes a first sealing body 1.

The first sealing body 1 includes a cooling base plate 11, a first sealing cover plate 12, and a first sealing tube 13; the cooling base plate 11 is used to contact the device to be cooled for cooling; the first sealing cover plate 12 is fixed on the cooling base plate 11 and together they form a first sealing cavity 10; the first sealing tube 13 is fixed on the first sealing cover plate 12, and is in communication with the first sealing cavity 10, together they form a liquid cooling channel for conveying the liquid cooling medium; a second sealing body 2, the second sealing body 2 includes a second sealing cover plate 21 and a second sealing tube 22, the second sealing cover plate 21 is fixed on the cooling base plate 11 and encloses the first sealing cover plate 12; the second sealing tube 22 is fixed on the second sealing cover plate 21, the second sealing cover plate 21 and the second sealing tube 22 together form the second sealing cavity 20, and the liquid cooling channel is located within the second sealing cavity 20.

More specifically, in this embodiment, the material of the first sealing cover plate 12 and the second sealing cover plate 21 can be the same or different, such as both being plastic, or the first sealing cover plate 12 being plastic and the second sealing cover plate 21 being metal. Thus, this embodiment does not specifically limit the material of the first sealing cover plate 12 and the second sealing cover plate 21.

It should be noted that the device to be cooled can refer to the integrated circuit boards such as CPU, GPU, etc. in electronic devices, including but not limited to IT products (such as servers, storage devices) and communication devices.

It can be understood that the liquid cooling channel described in this embodiment is located within the second sealing cavity 20, and can be considered as being surrounded by the second sealing cavity 20.

Compared with the related technology, the embodiments of the present application set a first sealing body 1 to achieve heat dissipation and cooling of the device to be cooled and itself; by setting a second sealing body 2, since the second sealing cover 21 and the second sealing tube 22 together form a second sealing cavity 20, even if there is a partial coolant leakage from the first sealing body 1, the coolant will not come into contact with the device to be cooled or other electronic devices, but will be contained in the second sealing cavity 20, preventing the device to be cooled or other electronic devices from being damaged due to contact with the coolant, thereby improving the safety of the liquid cooling device; In addition, the second sealing cover 21 houses the first sealing cover 12, and the liquid cooling channel is located inside the second sealing cavity 20, that is, no matter where the first sealing body 1 leaks, it can ensure that the leaked liquid is contained in the second sealing cavity 20, which gives the liquid cooling device superior sealing performance, and further improves the safety of the liquid cooling device 100.

Figure 4:
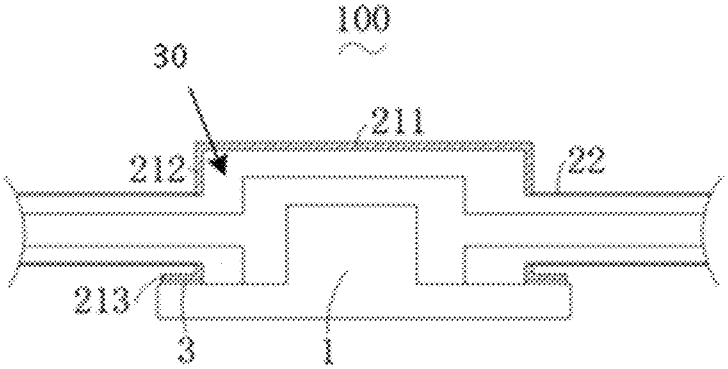
FIG. 4 is another schematic diagram of the structure of the liquid cooling device according to the first embodiment of the present application.

Please refer to FIG. 4. The second sealing cover plate 21 includes: an upper plate 211 located on the side of the first sealing cover plate 12 away from the cooling base plate 11, a side plate 212 that together with the upper plate 211 encloses a receiving space 30, and a contact plate 213 that extends from the edge of the side plate 212 away from the upper plate 211 and bends in the direction away from the first sealing cover plate 12. The liquid cooling device 100 also includes an adhesive part 3. The contact plate 213 is fixedly connected to the cooling base plate 11 via the adhesive part 3. This structure can increase the contact area between the second sealing cover plate 21 and the cooling base plate 11, thus allowing the second sealing cover plate 21 to be stably fixed on the cooling base plate 11. It can be understood that this embodiment does not specifically limit the contact area between the second sealing cover plate 21 and the cooling base plate 11 and can be set according to actual needs.

It is worth noting that the material of the adhesive part 3 in this embodiment is preferably pressure-sensitive adhesive, a type of adhesive sensitive to pressure. Generally, the peeling force of pressure-sensitive adhesive (the peeling force displayed after the adhesive tape is pressed and attached to the surface) is less than the cohesion force of the adhesive (the intermolecular force of the pressure-sensitive adhesive) which in turn is less than the adhesion force of the adhesive (the adhesion force between the adhesive and the substrate), thus preventing the adhesive from peeling off during use.

Figure 5:
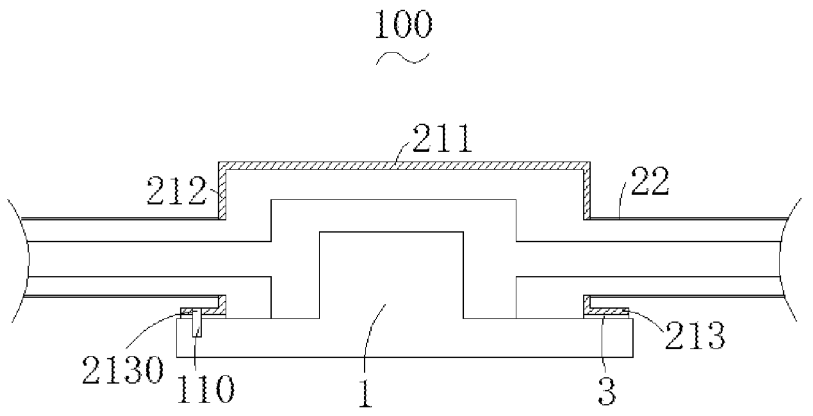
FIG. 5 is yet another schematic diagram of the structure of the liquid cooling device according to the first embodiment of the present application.

Please refer to FIG. 5. A first screw hole 2130 is provided on the contact plate 213, and a second screw hole 110 is provided on the cooling base plate 11. The first screw hole 2130 is directly opposite the second screw hole 110. The liquid cooling device 100 also includes a screw (not shown in the figure), which is fixed in the first screw hole 2130 and the second screw hole 110. This structure can make the connection between the second sealing cover plate 21 and the cooling base plate 11 more robust, thus further enhancing the stability of the liquid cooling device 100.

It should be noted that the screw shown in FIG. 3 is one, and in actual applications, there can be multiple screws (such as two, three, four . . . ), and these multiple screws can be equidistantly arranged around the side plate 212, to further enhance the stability of the liquid cooling device 100.

Figure 6:
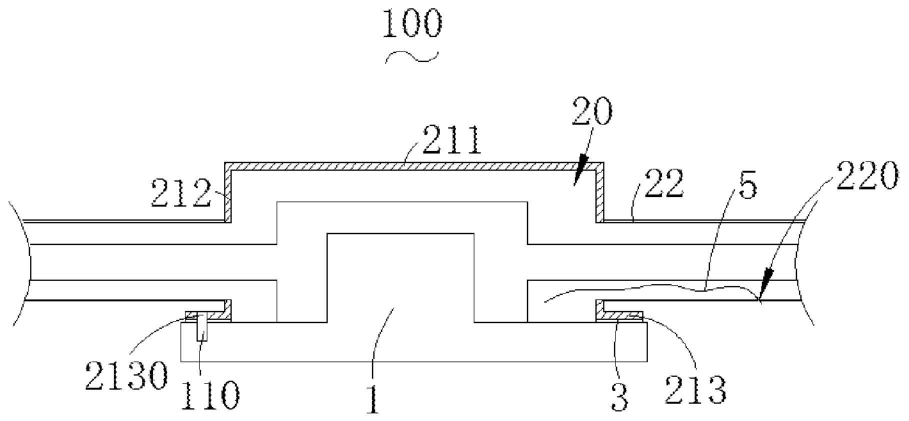
FIG. 6 is yet another schematic diagram of the structure of the liquid cooling device according to the first embodiment of the present application.

Please refer to FIG. 6. The liquid cooling device 100 also includes a liquid leakage sensor 5, which is located within the second sealing cavity 20 and outside the liquid cooling channel. The liquid leakage sensor 5 is used to send alarm information when it detects the presence of liquid within the second sealing cavity 20.

More specifically, the liquid leakage sensor 5 in this embodiment is rope-shaped. The rope-shaped liquid leakage sensor 5 can be placed in any position within the second sealing cavity 20 and outside the liquid cooling channel. For example, the liquid leakage sensor 5 can be wound around each connection of the first sealing body 1. This ensures that if there is any liquid leakage from any position of the first sealing body 1, the liquid leakage sensor 5 can promptly detect the liquid and send alarm information, thereby further improving the safety and reliability of the liquid cooling device 100.

Furthermore, as shown in FIG. 6, the second sealing tube 22 is equipped with an aperture 220. The liquid leakage sensor 5 extends through the aperture 220 and partially protrudes out of the second sealing cavity 20 to connect with the external circuit board. The liquid cooling device 100 also includes a sealing part (not shown in the figure) used to seal the aperture 220. It can be understood that after the liquid leakage sensor 5 passes through the aperture 220, there may be a gap between the liquid leakage sensor 5 and the aperture 220, causing the leaked liquid to flow out from the gap, thereby causing damage to the device to be cooled due to contact with the liquid. By setting up the sealing part to seal the aperture 220, that is to say, the sealing part seals the gap between the liquid leakage sensor 5 and the aperture 220, the leaked liquid will not flow out from the gap, thus further enhancing the safety of the liquid cooling device 100.

Please note that the materials of the sealing part and the adhesive part 3 in this embodiment can be the same or different. For example, the sealing part can be OCA glue, etc. This embodiment does not specifically limit the materials of the sealing part and the adhesive part 3.

It should also be noted that the sealing part in this embodiment can be a sealing glue, a sealing ring, or other sealing structures. In other words, this embodiment does not specifically limit the structural shape of the sealing part, which can be set according to actual needs, and it is only necessary to ensure that the leaked liquid will not flow out from the gap between the liquid leakage sensor 5 and the aperture 220.

It is worth mentioning that the plug of the liquid leakage sensor 5 can be used directly with the socket on the PCB circuit board, without the need for an additional socket. This not only ensures the normal operation of the liquid leakage sensor 5 but also minimizes the space required by the liquid cooling device 100.

Please refer to FIGS. 3 to 6 together. In this embodiment, the second sealing tube 22 has an aperture communicating with the outside, and the liquid in the second sealing cavity 20 is discharged to the outside through the aperture. This structure allows the second sealing tube 21 to act as a drain tube to drain the liquid in the second sealing cavity 20, improving the practicality of the liquid cooling device 100.

Preferably, the second sealing tube 22 in this embodiment is a first soft tube, and the first soft tube and the second sealing cover plate 21 are reinforced by a first predetermined manner. The first predetermined manner includes welding fixation and/or sealing part fixation. This structure can make the fixation between the second sealing cover plate 21 and the second sealing tube 22 more stable. It should be noted that by setting the second sealing tube as a first soft tube, due to the certain stretch performance of the soft tube, the aperture of the second sealing tube 22 can be ensured to communicate with the outside, thus ensuring that the liquid in the second sealing cavity 20 can be discharged via the second sealing tube 22.

Preferably, the second sealing tube 22 in this embodiment is a rigid tube, and the rigid tube and the second sealing cover plate 21 are reinforced by a second predetermined manner. The second predetermined manner includes one or more from welding fixation, sealing part fixation, screw fixation, and riveting fixation. This structure can make the fixation between the second sealing cover plate 21 and the second sealing tube 22 more stable. It should be noted that the material of the second sealing tube 22 can be the same as or different from the material of the second sealing cover plate 21. For example, both the second sealing tube 22 and the second sealing cover plate 21 can be made of plastic, or the second sealing cover plate 21 can be made of plastic and the second sealing tube 22 can be made of metal. By setting the second sealing tube 22 as a rigid tube, the binding strength of the second sealing cover plate 21 and the second sealing tube 22 can be enhanced, further improving the stability of the liquid cooling device 100.

Figure 7:
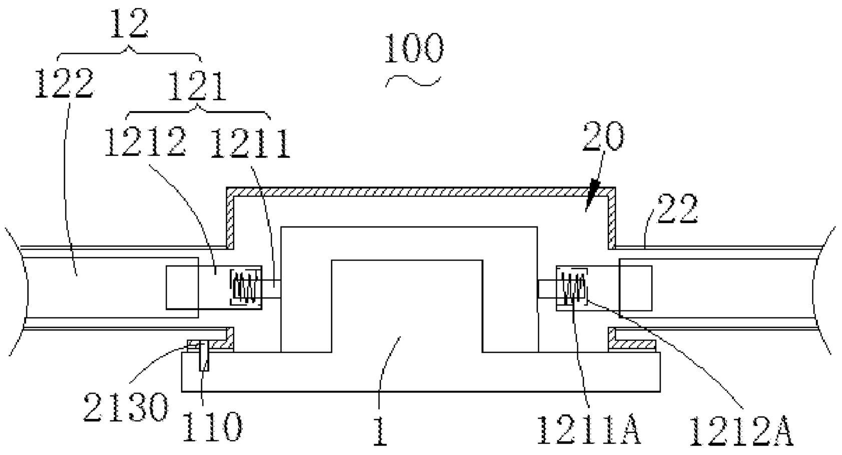
FIG. 7 is yet another schematic diagram of the structure of the liquid cooling device according to the first embodiment of the present application.
Figure 8:
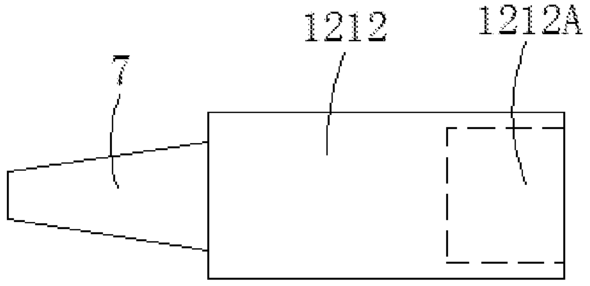
FIG. 8 is a schematic diagram of the structure of the limiting part according to the first embodiment of the present application.

Please refer to FIGS. 7 and 8 together. The first sealing tube 12 includes a joint 121 and a soft tube 122. One end of the joint 121 is fixed on the first sealing cover plate 11, and the other end of the joint 121 is equipped with a limiting part 7. The soft tube 122 is fixedly connected to the joint 121 through the limiting part 7.

Specifically, as shown in FIG. 7, the joint 121 includes a first joint 1211 and a second joint 1212. One end of the first joint 1211 is fixed on the first sealing cover plate 12 by welding or sealing part fixation, and the other end of the first joint 1211 is equipped with a first threaded part 1211A. One end of the second joint 1212 is equipped with a second threaded part 1212A that matches the first threaded part 1211A, and the other end of the second joint 1212 is equipped with a limiting part 7. The first threaded part 1211A and the second threaded part 1212A match each other to fix the first joint 1211 and the second joint 1212 together. This structure ensures a more stable connection between the first joint 1211 and the second joint 1212, and between the second joint 1212 and the soft tube 122. It prevents the liquid flowing in the liquid cooling channel from leaking from the connection points, thereby improving the safety of the liquid cooling device 100.

Furthermore, as shown in FIG. 8, the limiting part 7 is a hollow conical protrusion extending away from the end of the joint 121 that is away from the first sealing cover plate 12. The size of the hollow conical protrusion near the first sealing cover plate 12 is larger than that away from the first sealing cover plate 12. This structure ensures a firmer connection between the soft tube 122 and the joint 121, prevents the soft tube 122 from falling off, and improves the reliability of the liquid cooling device 100.

It is worth noting that in this embodiment, the hollow conical protrusion can be a hollow round conical protrusion, which makes it easier for the soft tube 122 to connect with the joint 121, reducing the manufacturing difficulty of the liquid cooling device 100. The hollow conical protrusion can also be a hollow pyramidal protrusion, which makes it harder for the soft tube 122 to move relative to the joint 121 after being fitted over the joint 121, further preventing the soft tube 122 from falling off, and enhancing the reliability of the liquid cooling device 100.

For better understanding, the following is a detailed explanation of the assembly process of the liquid cooling device 100 in this embodiment:

Weld the first sealing cover plate 12 onto the cooling base plate 11, then weld the first joint 1211 onto the first sealing cover plate 12 (the end of the first joint 1211 that is away from the first sealing cover plate 12 is equipped with a first threaded part 1211A).

Fix the second sealing cover plate 21 onto the cooling base plate 11 (fix with screws after setting a glue part 3 on the butt plate 213).

Connect and fix the second joint 1212 to the first joint 1211 (by matching the first threaded part 1211A and the second threaded part 1212A).

Connect the soft tube 122 to the second joint 1212.

Connect the second sealing tube 22 to the second sealing cover plate 21, thus completing the assembly of the liquid cooling device 100.

It's worth mentioning that the purpose of setting up the first joint 1211 and the second joint 1212 in this embodiment is: the accommodation space of the second sealing cover plate 21 is relatively small. Setting the first joint 1211 too long would increase the difficulty of installing the second sealing cover plate 21 (it's easier to install the second sealing cover plate 21 when the first joint 1211 is located within the accommodation space), and setting the first joint 1211 too short would lead to unstable fixation of the soft tube 122. Therefore, by additionally setting the second joint 1212, one end of the second joint 1212 is tightly fixed to the first joint 1211 via threading, and the other end of the second joint 1212 is tightly fixed to the soft tube 122 via the limiting part 7. This achieves a more stable connection between the first joint 1211 and the second joint 1212, and between the second joint 1212 and the soft tube 122, while reducing the installation difficulty of the liquid cooling device 100, and enhancing the safety of the liquid cooling device 100.

It should be noted that this embodiment does not specifically limit the number of joints 121. For example, only one joint can be set, and the setting can be based on actual needs.

Figure 9:
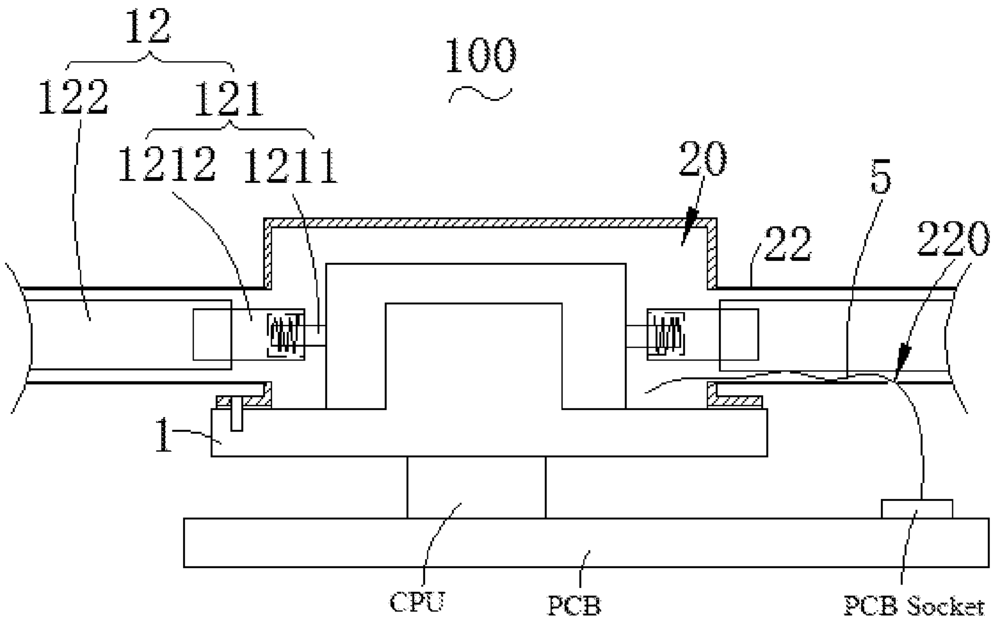
FIG. 9 is a schematic diagram of the structure of the liquid cooling device and the CPU chip according to the first embodiment of the present application.

Please refer to FIG. 9, which is a schematic diagram of the structure of the liquid cooling device 100 installed on a CPU chip in this embodiment. The CPU chip shown in FIG. 9 is set on a PCB circuit board. The cooling base plate 11 contacts the side of the CPU chip that is away from the PCB circuit board. The PCB circuit board is also equipped with a PCB socket, and the plug of the liquid leakage sensor 5 can be used with the PCB socket.

Figure 10:
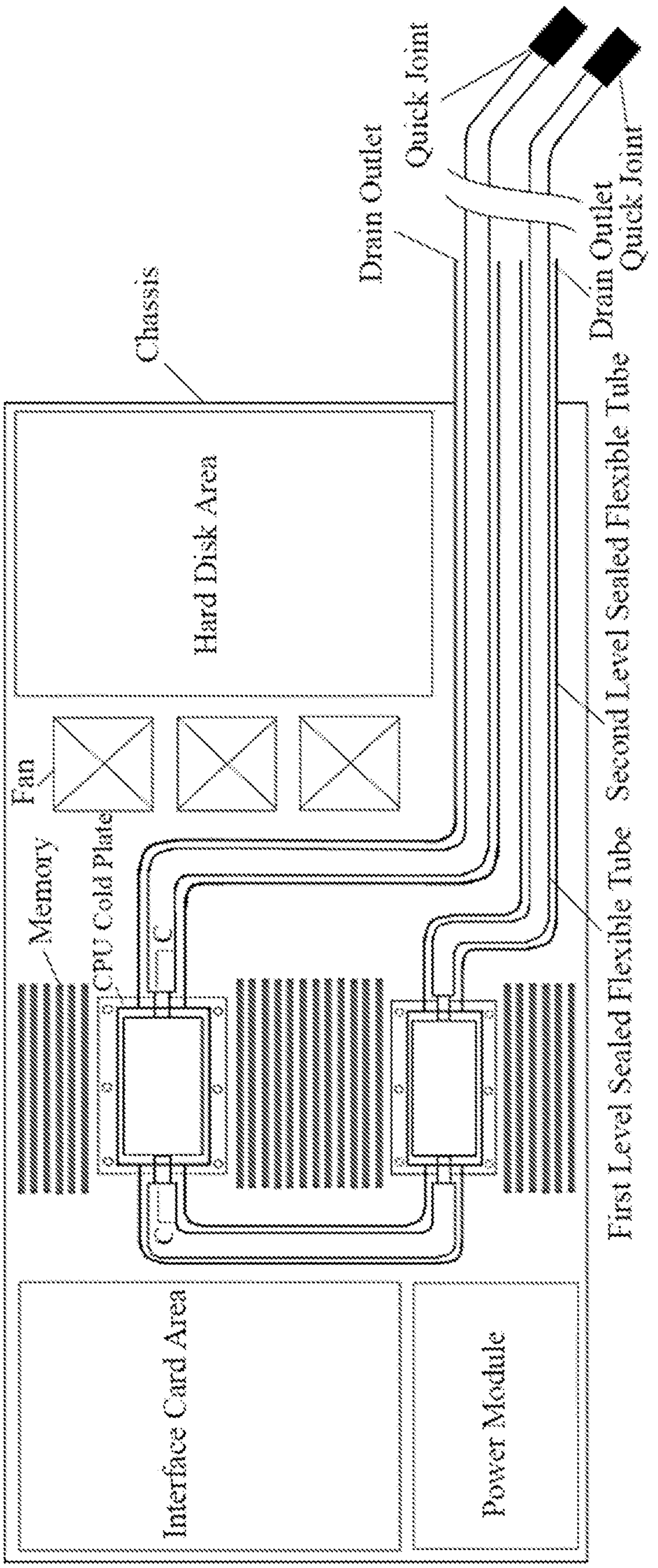
FIG. 10 is an upper view of the liquid cooling device and multiple CPU chips according to the first embodiment of the present application.

Please refer to FIG. 10. For a server system with two CPU chips, FIG. 10 provides a system layout diagram of the first and second seal bodies. As can be seen from FIG. 10, the second sealing body fully seals the possible liquid leakage locations in the first sealing body. Meanwhile, the soft tube of the second sealing body extends to the outside of the chassis. The end of the second sealing body's soft tube outside the chassis is open and can therefore serve as a drain outlet. The end of the soft tube of the first sealing cavity is equipped with a quick joint, which can be connected to a water storage device (not shown in the figure) to achieve the circulation of water in the liquid cooling channel.

Figure 11:
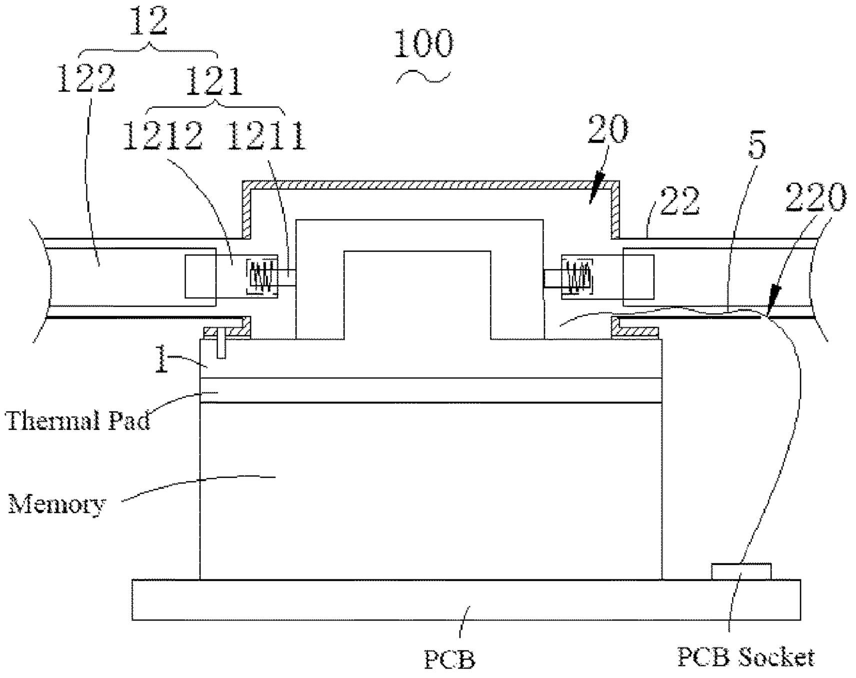
FIG. 11 is a schematic diagram of the structure of the liquid cooling device and memory according to the first embodiment of the present application.

Please refer to FIG. 11, which is a schematic diagram of the structure of the liquid cooling device 100 installed on memory in this embodiment. The memory shown in FIG. 11 is set on a PCB circuit board. The thermal pad contacts the side of the memory that is away from the PCB circuit board, and the cooling base plate 11 contacts the side of the thermal pad that is away from the memory. The PCB circuit board also has a PCB socket, and the plug of the liquid leakage sensor 5 can be used with the PCB socket.

Figure 12:
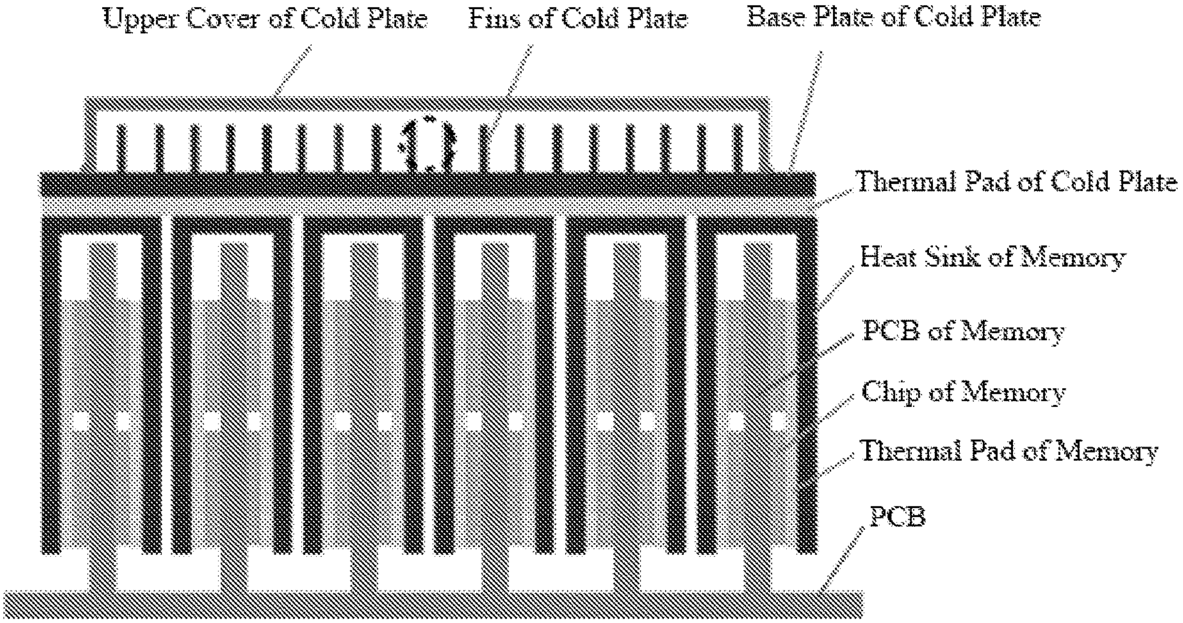
FIG. 12 is a schematic diagram of the structure of the memory and part of the first sealing body according to the first embodiment of the present application.

Please refer further to FIG. 12, which is a structural schematic diagram of the memory and part of the first sealing body. The heat of the memory chip is transferred to the memory thermal pad through the memory thermal pad, and then the memory thermal pad transfers the heat to the cooling base plate 11 through the thermal pad.

The second embodiment of the present application relates to a device, including: a device to be cooled, and the liquid cooling device in the above embodiments. The liquid cooling device is used to contact the device to be cooled to cool it.

It can be understood that the device described in this embodiment includes but is not limited to IT products (such as servers, storage devices), communication devices, and electrical/electric power devices that can use the liquid cooling device.

The skilled in the art can understand that the above embodiments are specific implementations to realize the present application, and various changes in form and details can be made in actual applications without departing from the spirit and scope of the present application.

What is claimed is:

1. A liquid cooling device comprising:

a first sealing body, which comprises a cooling base plate, a first sealing cover plate, and a first sealing tube; the cooling base plate is used to contact a device to be cooled, to cool the device to be cooled; the first sealing cover plate is fixed on the cooling base plate, and together with the cooling base plate forms a first sealing cavity; the first sealing tube is fixed on the first sealing cover plate, and is in communication with the first sealing cavity, the first sealing tube and the first sealing cavity together form a liquid cooling channel used for conveying a liquid cooling medium; and a second sealing body, which comprises a second sealing cover plate with a receiving space and a second sealing tube, the second sealing cover plate is fixed on the cooling base plate, and covers the first sealing cover plate; the second sealing tube is fixed on the second sealing cover plate, the second sealing cover plate and the second sealing tube together form a second sealing cavity, and the whole liquid cooling channel is located in the second sealing cavity, and the device to be cooled is located outside the second sealing cavity;

wherein that the first sealing tube comprises a joint and a stretchable tube, one end of the joint is fixed on the first sealing cover plate, the other end of the joint has a limiting part, the stretchable tube is fixedly connected to the joint via the limiting part;

wherein the limiting part is a hollow conical protrusion extending from the end of the joint away from the first sealing cover plate, in a direction away from the first sealing cover plate; the size of the hollow conical protrusion near the first sealing cover plate is greater than the size of the hollow conical protrusion far from the first sealing cover plate.

2. The liquid cooling device according to claim 1, wherein the second sealing cover plate comprises: a upper plate located on the side of the first sealing cover plate away from the cooling base plate, a side plate that together with the upper plate forms the receiving space, a contact plate that extends from the edge of the side plate away from the upper plate in the direction away from the first sealing cover plate;

the liquid cooling device further comprises an adhesive part, the contact plate is fixedly connected to the cooling base plate via the adhesive part.

3. The liquid cooling device according to claim 2, wherein that the contact plate has a first screw hole, the cooling base plate has a second screw hole, the first screw hole is directly opposite the second screw hole;

the liquid cooling device further comprises a screw, the screw is fixed in the first screw hole and the second screw hole.

4. The liquid cooling device according to claim 1, wherein that the liquid cooling device further comprises a liquid leakage sensor, the liquid leakage sensor is set in the second sealing cavity and is located outside the liquid cooling channel, the liquid leakage sensor is used to send an alarm message when it senses the presence of liquid in the second sealing cavity.

5. The liquid cooling device according to claim 4, wherein that the second sealing tube has an aperture, the liquid leakage sensor extends partially out of the second sealing cavity through the aperture to connect with an external circuit board;

the liquid cooling device further comprises a sealing part, the sealing part is used to seal the aperture.

6. The liquid cooling device according to claim 1, wherein that the second sealing tube is in communication with the receiving space and has an aperture in communication with the outside, the liquid in the second sealing cavity is discharged to the outside through the aperture.

7. The liquid cooling device according to claim 1, wherein the second sealing tube is a stretchable tube, the stretchable tube and the second sealing cover plate are reinforced by a first predetermined manner, the first predetermined manner comprises welding fixation and/or sealing part fixation.

8. The liquid cooling device according to claim 1, wherein that the second sealing tube is a rigid tube, the rigid tube and the second sealing cover plate are reinforced by a second predetermined manner, the second predetermined manner comprises one or more from welding fixation, sealing part fixation, screw fixation, or rivet fixation.

9. An apparatus comprising:

a device to be cooled; and a liquid cooling device configured to be used to contact the device to be cooled, to cool the device to be cooled, the liquid cooling device comprising:

a first sealing body, which comprises a cooling base plate, a first sealing cover plate, and a first sealing tube; the cooling base plate is used to contact the device to be cooled, to cool the device to be cooled; the first sealing cover plate is fixed on the cooling base plate, and together with the cooling base plate forms a first sealing cavity; the first sealing tube is fixed on the first sealing cover plate, and is in communication with the first sealing cavity, the first sealing tube and the first sealing cavity together form a liquid cooling channel used for conveying a liquid cooling medium; and a second sealing body, which comprises a second sealing cover plate with a receiving space and a second sealing tube, the second sealing cover plate is fixed on the cooling base plate, and covers the first sealing cover plate; the second sealing tube is fixed on the second sealing cover plate, the second sealing cover plate and the second sealing tube together form a second sealing cavity, and the whole liquid cooling channel is located in the second sealing cavity, and the device to be cooled is located outside the second sealing cavity;

wherein the first sealing tube comprises a joint and a stretchable tube, one end of the joint is fixed on the first sealing cover plate, the other end of the joint has a limiting part, the stretchable tube is fixedly connected to the joint via the limiting part, wherein the limiting part is a hollow conical protrusion extending from the end of the joint away from the first sealing cover plate, in a direction away from the first sealing cover plate; the size of the hollow conical protrusion near the first sealing cover plate is greater than the size of the hollow conical protrusion far from the first sealing cover plate.

10. The apparatus according to claim 9, wherein the liquid cooling device further comprises an adhesive part, wherein the second sealing cover plate comprises:

an upper plate located on the side of the first sealing cover plate away from the cooling base plate;

a side plate that together with the upper plate forms the receiving space; and a contact plate that extends from the edge of the side plate away from the upper plate in the direction away from the first sealing cover plate, the contact plate fixedly connected to the cooling base plate via the adhesive part.

11. The apparatus according to claim 10, wherein the contact plate has a first screw hole, the cooling base plate has a second screw hole, the first screw hole is directly opposite the second screw hole; and the liquid cooling device further comprises a screw, and the screw is fixed in the first screw hole and the second screw hole.

12. The apparatus according to claim 10, wherein the liquid cooling device further comprises a liquid leakage sensor, the liquid leakage sensor is set in the second sealing cavity and is located outside the liquid cooling channel, the liquid leakage sensor is used to send an alarm message when it senses the presence of liquid in the second sealing cavity.

13. The apparatus according to claim 12, wherein the second sealing tube has an aperture, the liquid leakage sensor extends partially out of the second sealing cavity through the aperture to connect with an external circuit board; and the liquid cooling device further comprises a sealing part, the sealing part is used to seal the aperture.

14. The apparatus according to claim 10, wherein the second sealing tube is in communication with the receiving space and has an aperture in communication with the outside, the liquid in the second sealing cavity is discharged to the outside through the aperture.

15. The apparatus according to claim 10, wherein the second sealing tube is a stretchable tube, the stretchable tube and the second sealing cover plate are reinforced by a first predetermined manner, the first predetermined manner comprises welding fixation and/or sealing part fixation.

16. The apparatus according to claim 10, wherein the second sealing tube is a rigid tube, the rigid tube and the second sealing cover plate are reinforced by a second predetermined manner, the second predetermined manner comprises one or more from welding fixation, sealing part fixation, screw fixation, or rivet fixation.

* * * * *